United States Patent [19]
Kunimine et al.

[11] Patent Number: 5,713,034
[45] Date of Patent: Jan. 27, 1998

[54] CAE SYSTEM FOR PREPARING TRANSMISSION NETWORK AND ANALYZING LOAD IN MECHANICAL SYSTEM

[75] Inventors: Naoki Kunimine; Masakatsu Fukai; Noboru Kimura; Toshiyuki Kanou, all of Tokyo, Japan

[73] Assignee: Oki Electric Industry Co., Ltd., Tokyo, Japan

[21] Appl. No.: 738,000

[22] Filed: Jul. 30, 1991

[30] Foreign Application Priority Data

| Aug. 7, 1990 | [JP] | Japan | 2-207674 |
| Nov. 2, 1990 | [JP] | Japan | 2-298154 |

[51] Int. Cl.[6] .................................... G06F 17/50
[52] U.S. Cl. .................. 395/800; 395/964; 364/474.24; 364/578
[58] Field of Search ............... 364/474.01, 476.24, 364/191, 192, 578; 395/800

[56] References Cited

U.S. PATENT DOCUMENTS

| 4,549,275 | 10/1985 | Sukonick | 395/121 |
| 4,697,240 | 9/1987 | Cedar et al. | 364/474.02 |
| 4,849,911 | 7/1989 | Campian | 395/141 |
| 4,864,520 | 9/1989 | Setoguchi et al. | 364/560 |
| 4,922,432 | 5/1990 | Kobayashi et al. | 364/490 |
| 4,984,180 | 1/1991 | Wada et al. | 395/133 |

FOREIGN PATENT DOCUMENTS

| 59-220867 | 4/1985 | Japan . |
| 60-151784 | 8/1985 | Japan . |
| 61-115173 | 10/1986 | Japan . |
| 63-137451 | 10/1988 | Japan . |
| 1-171066 | 7/1989 | Japan . |
| 1-229374 | 12/1989 | Japan . |
| 2-76077 | 3/1990 | Japan . |
| 2-82364 | 3/1990 | Japan . |

OTHER PUBLICATIONS

Krishnan et al., "Computer Aided Design of Electrical Machines . . . " IEEE vol. 35, No. 4, Nov. 1988.
SDRC I-DEAS V, Finite Element Modeling & Analysis (Training Text), Structural Dynamics Research Corporation, copyright 1991, Information Services International—Dentu, Ltd.

Primary Examiner—Parshotam S. Lall
Assistant Examiner—Viet Vu
Attorney, Agent, or Firm—Spencer & Frank

[57] ABSTRACT

In a CAE system for preparing a transmission network for a mechanical system, a connection of components retrieving and processing portion fetches graphic data concerning the mechanical system from a graphic data memory portion, retrieves connection relationships between respective components, and prepares connection data which are stored in a connection data memory portion. The graphic data includes form data specifying the physical configuration of the components of the mechanical system. A transmission network can be automatically prepared based on the form data. The graphic data for each component of the mechanical system can be supplied by a CAD, or a form data input portion can be employed. The graphic data and the connection data are supplied to an operation processing portion, which calculates the load applied to a driving source by the mechanical system. The CAE system may include a sliding connection retrieving and processing portion, which receives the connection data and detects whether the mechanical system includes a sliding portion. If so, the load imposed by the sliding portion is calculated. The resultant calculation is supplied to the operation processing portion, where the total load applied to the driving source is calculated.

21 Claims, 10 Drawing Sheets

| | PULLEY 31 | PULLEY 32 | BELT 33 |
|---|---|---|---|
| PULLEY 31 | 0 | 0 | 1 |
| PULLEY 32 | 0 | 0 | 1 |
| BELT 33 | 1 | 1 | 0 |

0 : NOT CONNECTED
1 : CONNECTED

Fig. 15

CAE SYSTEM FOR PREPARING TRANSMISSION NETWORK AND ANALYZING LOAD IN MECHANICAL SYSTEM

BACKGROUND OF THE INVENTION

1. Field of the Invention

The present invention relates to a computer aided design, analysis and calculation system, a so-called computer aided engineering (CAE) system, more particularly to a CAE system for preparing a transmission network in a mechanical system and analyzing the load imposed by each component of the mechanical system.

Components such as gears, pulleys, belts, rollers and the like are connected with one another to form a mechanical system. Energy supplied by a motor is transmitted to these components according to connection relationships between the components. It is known to prepare a transmission network graph representing the transmission of the force to components of a mechanical system manually, and to analyze the mechanical system on the basis of the transmission network.

In designing a mechanical system composed of gears, pulleys, belts, rollers and the like, it is necessary to calculate the load applied to the motor as a driving source in order to determine the capacity of the motor. This load depends on the moment of inertia of each component consitituting the mechanical system, the loads imposed by belts and rollers, the frictional load of the sliding parts, dispersion of loads caused by wear, and the load caused by any sliding contact between the components. Although methods for calculating the load of component of a mechanical system have been established, a method for treating a mechanical system as a while has not. As a result, load calculation by conventional techniques requires extensive processing and it is difficult to obtain accurate results.

As a practical matter, load calculation by conventional techniques depends on intuition and the experience of the designer, augmented by experiment.

So-called CAE systems come into wide use and have been applied for analyzing mechanical systems. Although there is a CAE system for calculating the moment of inertia of individual components or parts, no CAE system is available for analyzing a mechanical system as a whole.

Accordingly, the load on the driving source has to be analyzed manually.

Manual analysis of a transmission network for a mechanical system has the following drawbacks:

(1) It takes much time for preparing the transmission network.

(2) Many mistakes occur due to the manual calculations.

(3) Since the system requires an engineering calculation of the entire mechanical system, it is troublesome to input data for preparing the transmission network.

Furthermore, manually calculating the load applied to a motor which drives a mechanical system and determining the capacity of the motor has the following drawbacks:

(1) Manual calculation of the loads on the driving motor requires an extensive number of computations, thus contributing to erroneous results.

(2) The dispersion or variation in the load imposed by each component or part due to aging or temperature variations can only be obtained by experiment, which takes much time.

SUMMARY OF THE INVENTION

It is an object of the present invention to provide a CAE system which can prepare automatically a transmission network and further can analyze an entire mechanical system.

It is another object of the present invention to provide a CAE system for automatically preparing a transmission network based on graphic data supplied by a CAD.

It is a further object of the present invention to provide a CAE system which can calculate the load applied to a driving source and which is capable of automatically calculating the load imposed by a mechanical system and variations in the load imposed by each component in the system.

To achieve the above objects, a CAE system for preparing a mechanical system transmission network according to the present invention comprises a form data input portion for inputting graphic data which provides information about forms and positions of each component in the mechanism system, a graphic data memory portion for storing the graphic data supplied by the form data input portion, a connection of components retrieving and processing portion for fetching form data for the mechanical system from the graphic data memory portion and preparing connection data which provides information about connection relationships between respective components, and a connection data memory portion for storing the connection data therein.

A CAE system for analyzing the load imposed by components of a mechanical system according to the present invention comprises a form data input portion for inputting graphic data which includes information about the forms, positions, materials and connecting states of the different components of the mechanism system, a graphic data memory portion for storing the graphic data supplied by the form data input portion, a connection of components retrieving and processing portion for fetching form data from the graphic data memory portion and preparing connection data showing connection relationships between respective components, a connection data memory portion for storing the connection data therein and an operation processing portion for calculating the load applied to a driving source of the mechanism system based on the graphic data, the connection data and the load data at a sliding portion.

BRIEF DESCRIPTION OF THE DRAWINGS

FIGS. 1, 1A and 1B together illustrate a block diagram of a CAE system according to a preferred embodiment of the present invention;

DESCRIPTION OF THE PREFERRED EMBODIMENT

First Embodiment (FIGS. 1 to 11)

A CAE system for analyzing the load imposed by each component of a mechanical system will be described with reference to FIGS. 1 to 11.

Figure 1A:
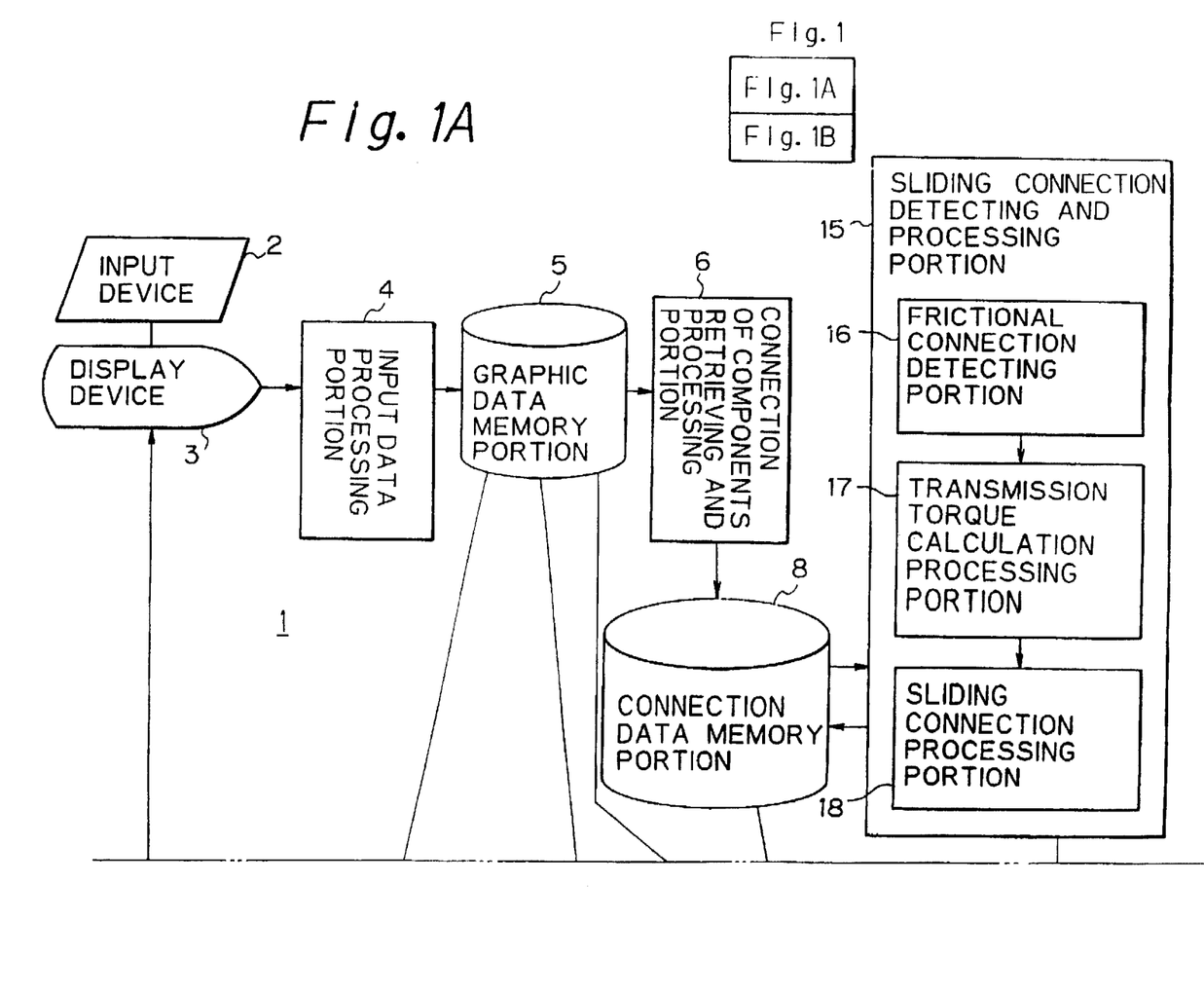
Figure 1B:
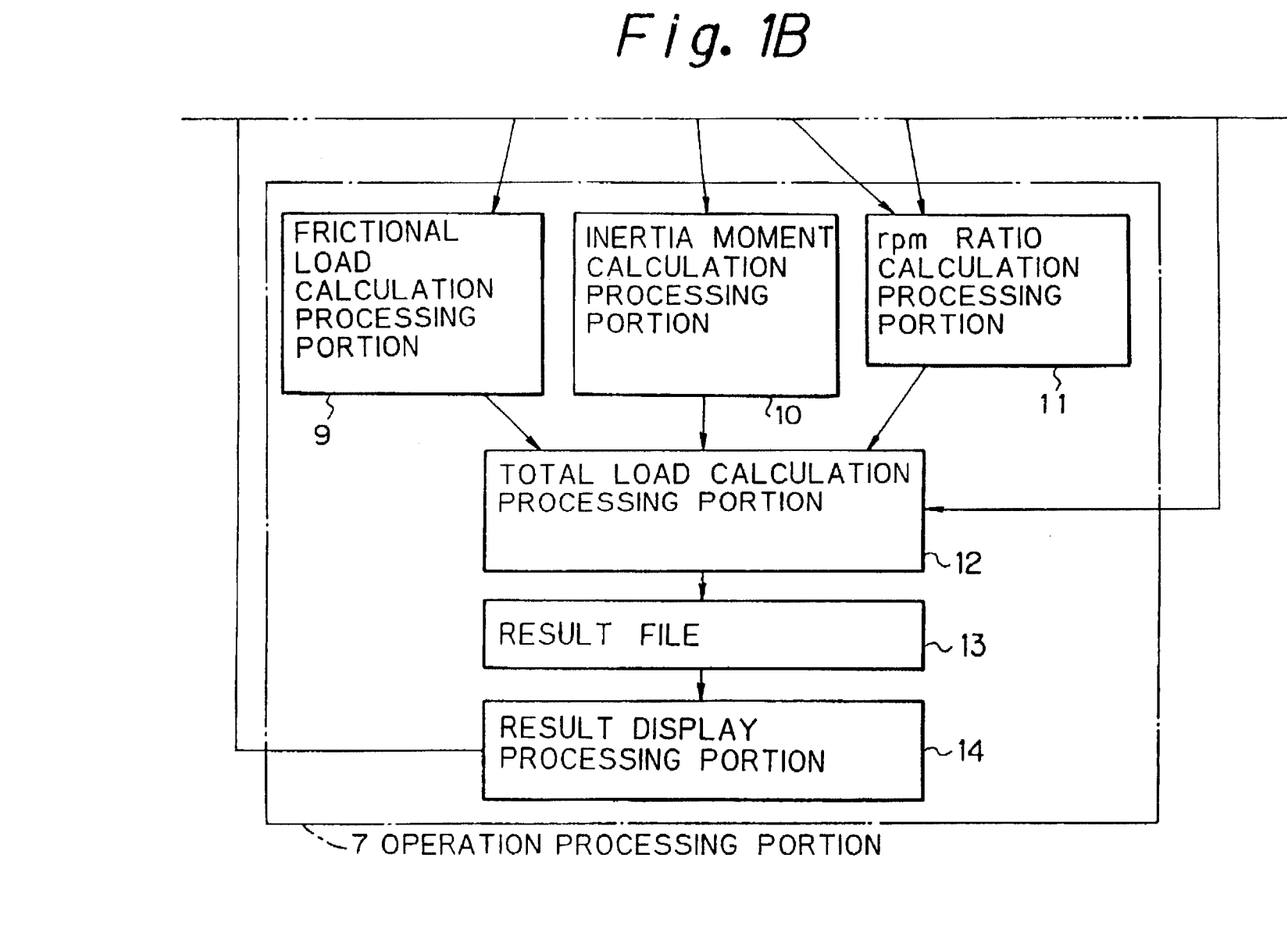

FIGS. 1A and 1B together are a block diagram showing the arrangement of the CAE system of the present invention.

Figure 2:
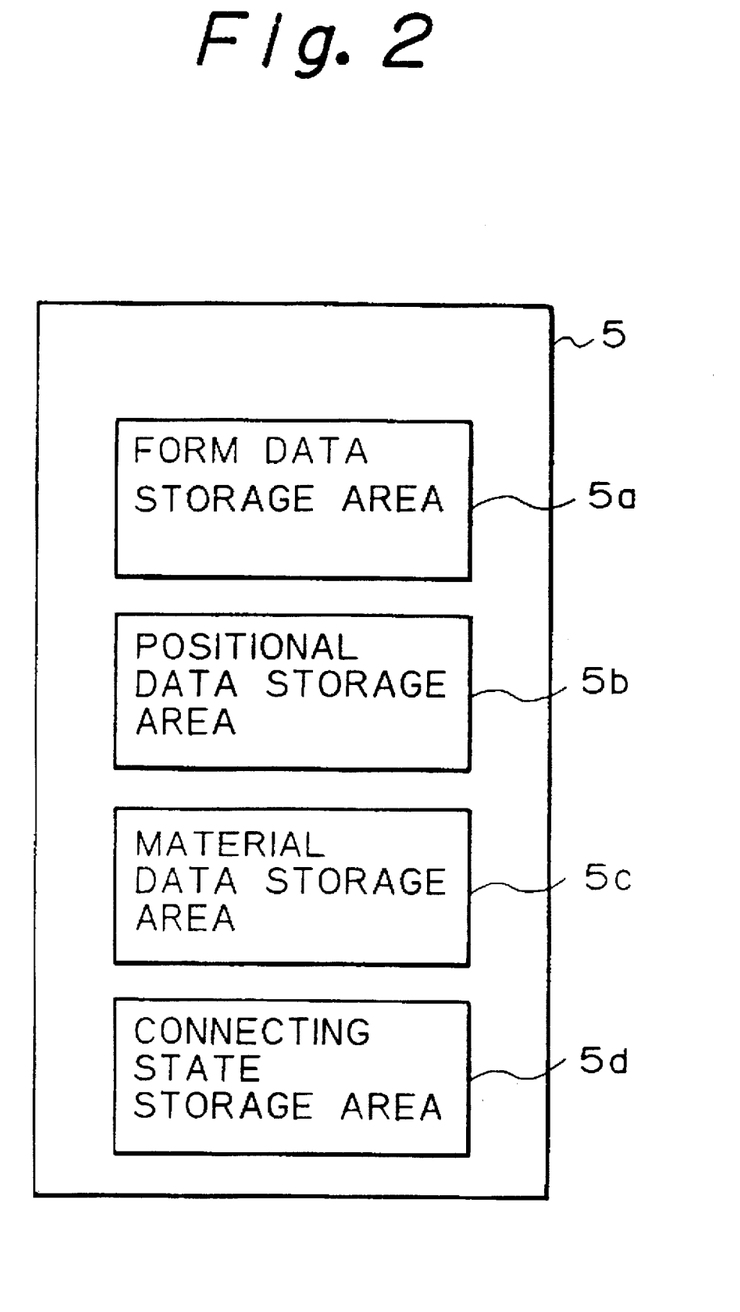
FIG. 2 is a memory map showing a graphic data memory portion.

The CAE system analyzes the load imposed by each component of a mechanical system composed of gears, belts, pulleys, rollers and the like. The CAE system 1 comprises an input portion 2, which is composed of a coordinate input device such as a mouse or a digitizer and an input device such as a keyboard, and a display device 3 for indicating the input and a processed result. Data for each component constituting the mechanical system are supplied from the input device 2. An input data processing portion is connected to the display device 3. The input data processing portion 4 fetches each input data supplied by the input device 2 and provides graphic data, which is stored in a graphic data memory portion 5 or which is used to update the content stored in the graphic data memory portion 5. The graphic data memory portion 5 comprises, as illustrated in FIG. 2 showing a memory map thereof, a form data storage area 5a, a positional data storage area 5b, a material data storage area 5c and a connecting state storage area 5d.

The graphic data memory portion 5 is connected to a connection of components retrieving and processing portion 6 and an operation processing portion 7. The connection of components retrieving and processing portion 6 prepares connection data representing the connection relationships between the components of the mechanical system based on the graphic data. The connection data is stored in a connection data memory portion 8.

The operation processing portion 7 comprises a frictional load calculation processing portion 9, an inertia moment calculation processing portion 10, an rpm ratio calculation processing portion 11, a total load calculation processing portion 12, a result file 13 and a result display processing portion 14. The frictional load calculation processing portion 9 calculates frictional loads for each component. The inertia moment calculation processing portion 10 calculates the moment of inertia of each component. The rpm ratio calculation processing portion 11 calculates the rpm of the driving source. The resultant calculations are supplied to the total load calculation processing portion 12, where the load applied to the driving source is calculated. The resultant calculation is stored in the result file 13. The result display processing portion 14 fetches the resultant calculation from the result file 13 and supplies it to the display device 3.

A sliding connection detecting and processing portion 15 is connected to the connection data memory portion 8. The sliding connection detecting and processing portion 15 detects whether a sliding portion is present in the mechanical system and calculates the load imposed by the sliding portion if one is detected. The sliding connection detecting and processing portion 15 comprises a frictional connection detecting portion 16, a transmission torque calculation processing portion 17 and a sliding connection processing portion 18. The frictional connection detecting portion 16 detects whether the mechanical system has a frictional connection portion, i.e., a sliding portion, and the transmission torque calculation processing portion 17 calculates the transmission torque at the detected sliding portion. The sliding connection processing portion 18 calculates the load imposed by the sliding portion.

Figure 3:
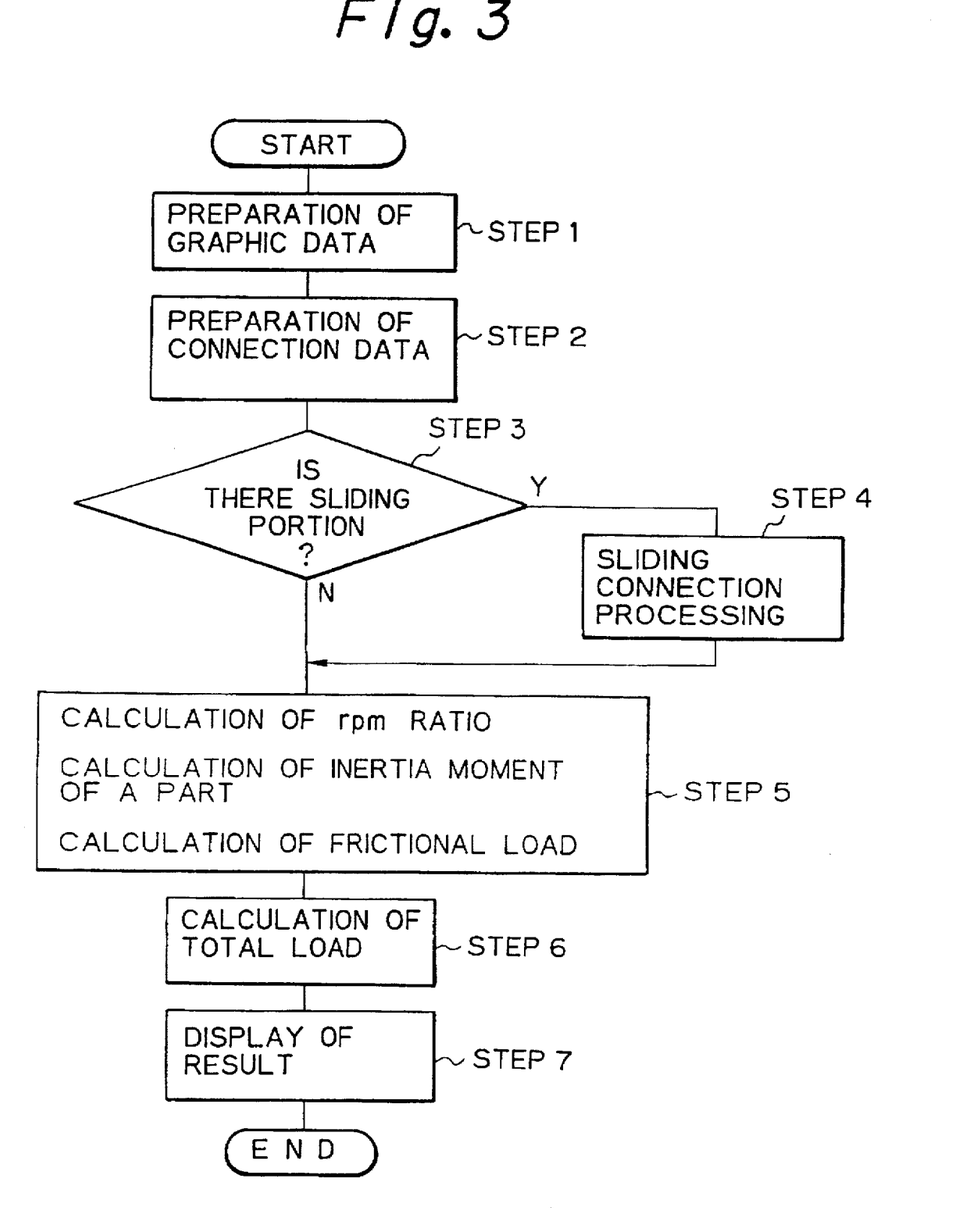
FIG. 3 is a flowchart showing the operation of the CAE system in FIG. 1.

The operation of the CAE system according to the first embodiment of the present invention will be described with reference to the flowchart shown in FIG. 3. To facilitate the explanation, the operation will be described with reference to a model of a mechanical system. This represents part of a larger mechanical system and is used for explaining the analysis of the load.

Figure 4:
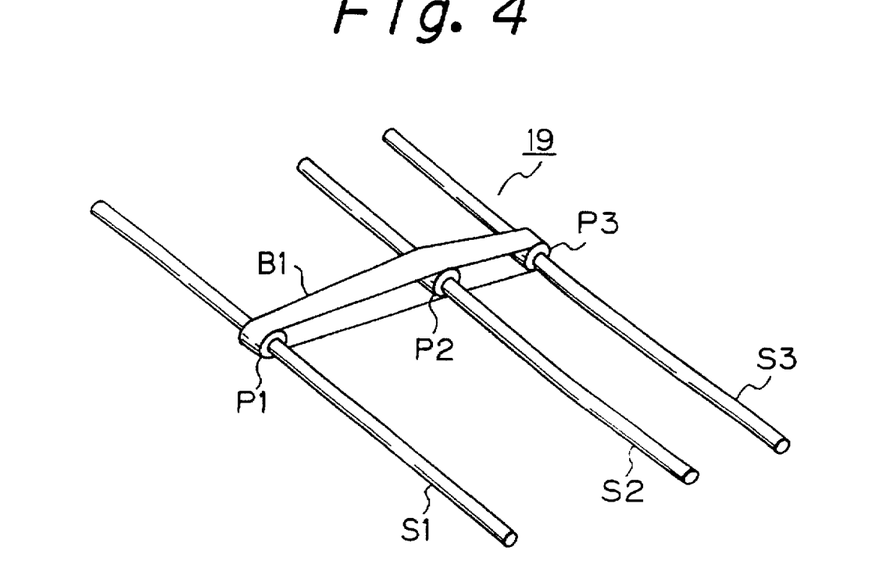
FIG. 4 is a perspective view of a model of a mechanical system.

In FIG. 4, a pulley P1 is attached to a drive shaft S1. A belt B1 is girded around the pulley 1, a pulley P3 attached to a shaft S3, and a pulley P2 attached to a shaft S2. The belt B1 transmits the rotation of the driving shaft S1 to the shafts S2 and S3.

Figure 5:
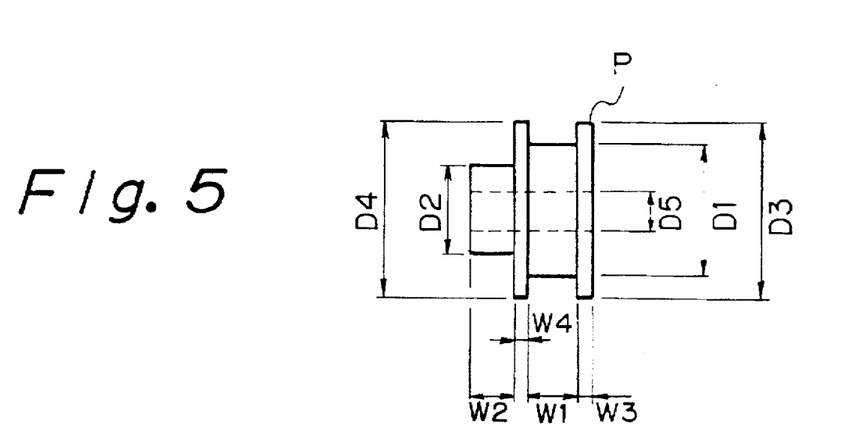
FIG. 5 is a view showing graphic parameters of pulleys in the mechanical system of FIG. 4.

Data concerning each component of the mechanical system 19 in FIG. 4 are inputted into the input device 2 of the CAE system illustrated in FIG. 1. For example, the data concerning the pulleys P1, P2, and P3 are inputted according to a form parameter of a pulley P as illustrated in FIG. 5. The form parameter of the pulley P is indicated in the display 3. The operator inputs parameters corresponding to the forms of the pulleys that are to be used, the pulleys P1, P2 and P3 in this case, with use of the mouse or the keyboard while the operator monitors the display. The form parameters D1 to D5 and W1 to W5 of the pulleys as illustrated in FIG. 5 are stored in a memory portion (not shown) incorporated in the input data processing portion 4. Positional data specifying the positions of the pulley P1, P2 and P3 are inputted as three-dimentional coordinate values, and material data for the pulleys are also inputted. The operator also inputs form data, positional data and material data concerning the other components, i.e. the shafts and the belt.

The input data processing portion 4 generates data showing the connecting state of each component based on the form data and the positional data. The processings set forth above are conducted in Step 1, the step of the preparation of the graphic data. It is also possible to fetch the graphic data from another system such as a CAD system.

The graphic data memory portion 5 stores the graphic data, i.e. the form data, the positional data, the material data and the data showing the connecting state between respective components.

Figure 6:
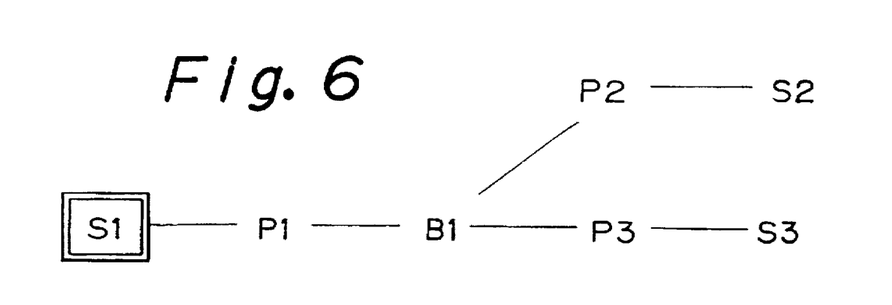
FIG. 6 is a view showing an example of connection data for the mechanical system of FIG. 4.

The connection of components retrieving and processing portion 6 extracts the connection relationships between respective components based on the graphic data as illustrated in FIG. 6 (Step 2). FIG. 6 is a view explaining an example of connection data when there is no sliding between respective components.

Each numeral in FIG. 6 corresponds to one of the components in FIG. 4. The prepared connection data memory are supplied to the connection data portion 8, where they are stored.

Figure 7:
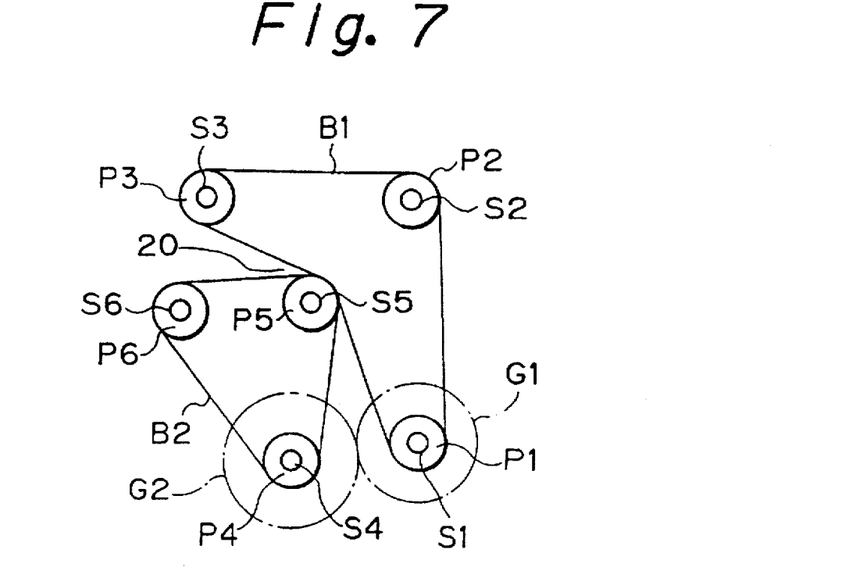
FIG. 7 is a view showing a mechanical system with a sliding portion.
Figure 8:
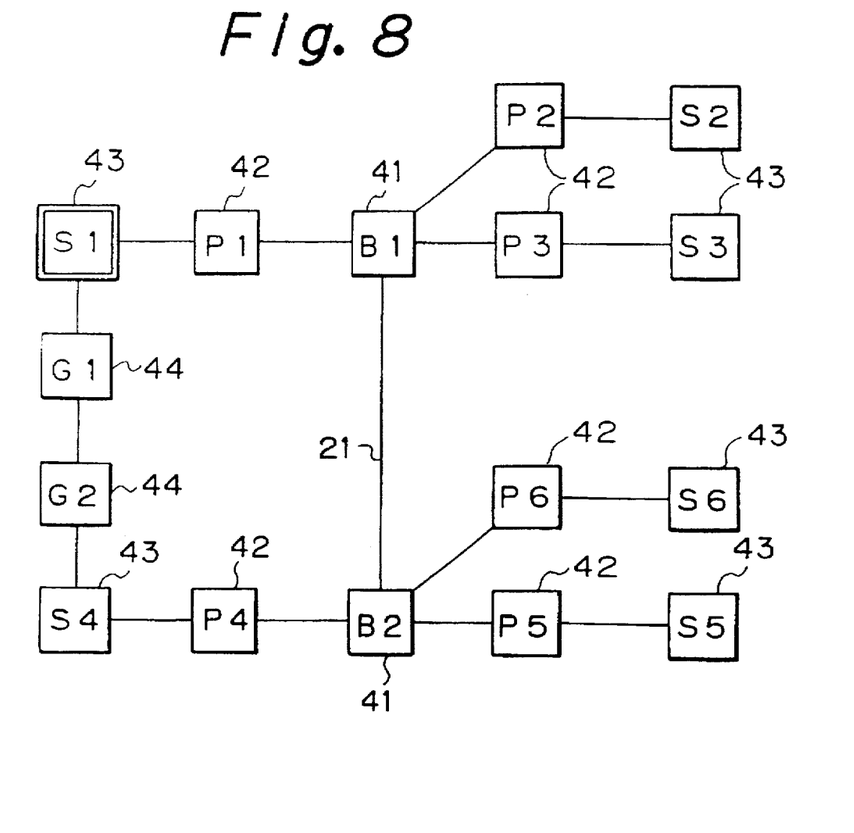
FIG. 8 is a view showing an example of connection data for the mechanical system of FIG. 7.

The frictional connection detecting portion 16 of the sliding connection detecting and processing portion 15 judges as to whether there is a sliding portion in the mechanical system based on the connection data (Step 3). A sliding portion is illustrated in FIG. 7, wherein the slide occurs at a contact portion 20 where a belt B1 contacts a belt B2 in case that the rpm of the belt B1 is different from the rpm of the belt B2. The presence of a sliding portion is detected, e.g., by detecting a loop 21 in the connection data as illustrated in FIG. 8. If a sliding portion exists in the mechanical system, the process goes to Step 4 where the load imposed by the sliding portion is calculated. The load imposed by the sliding portion can be calculated in the following manner.

The transmission torque calculation processing portion 17 calculates the transmission torque of each component when the frictional connection detecting portion 16 completes the detection of all the sliding portions in each component of the mechanical system. Then, the sliding connection processing portion 18 calculates the load for the sliding portions. The resultant calculated load is supplied to the total load calculation processing portion 12 of the operation processing portion 7 (Step 4).

The processing in Step 4 is omitted if there are no sliding portions in the mechanical system.

Figure 9:
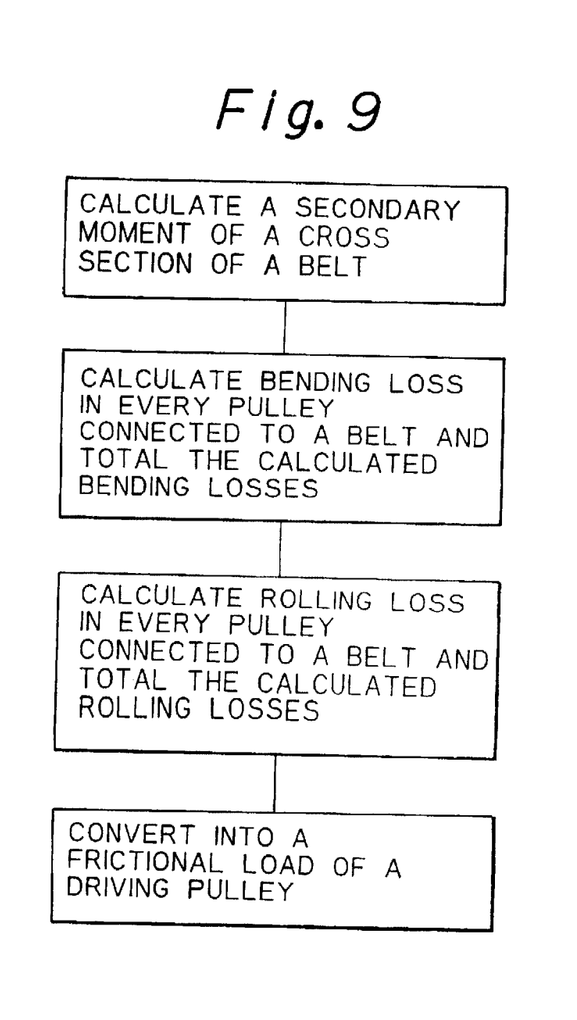
FIG. 9 is a flowchart showing an example of calculation of a frictional load caused by belt tension.
Figure 10:
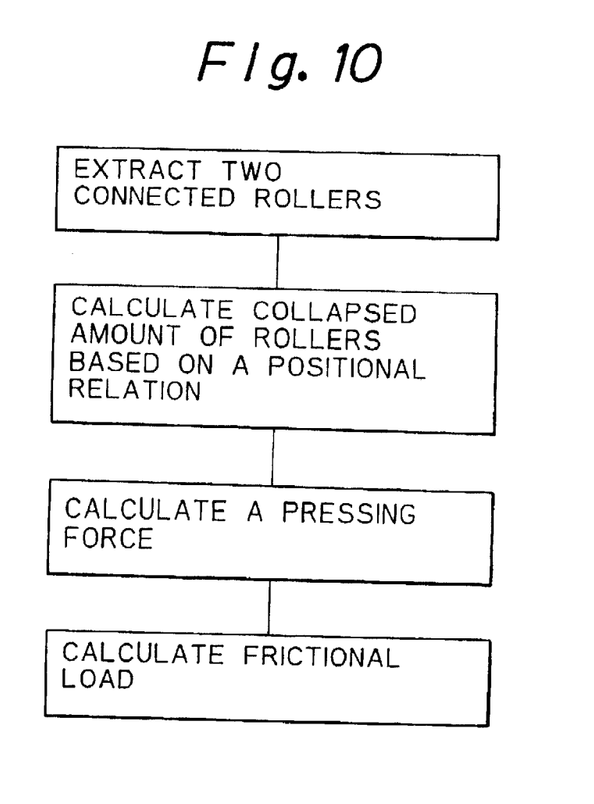
FIG. 10 is a flowchart showing an example of calculation of the pressing force of a roller.

The graphic data stored in the graphic data memory portion 5 and the connection data stored in the connection data memory portion 8 are supplied to the operation processing portion 7, where each component of the mechanical system is subjected to processing (Step 5). The graphic data is supplied to the frictional load calculation processing portion 9, where the frictional load between respective components due to the tension of belts, the pressing force of rollers and the like, is calculated based on the form data and the positional data of each component according to the flowcharts as illustrated in FIGS. 9 and 10. The inertia moment calculation processing portion 10 extracts, upon reception of the graphic data, the form data of each component and calculates the moment of inertia of each component. The rpm ratio calculation processing portion 11 calculates, upon reception of the graphic data and the connection data, the rpm of the driving source relative to each component.

The resultant calculation in Step 5 is supplied to the total load calculation processing portion 12, where the load applied to the driving source is calculated by adding the load imposed by any sliding portions obtained in Step 4, if such sliding portions exist (Step 6).

Figure 11:
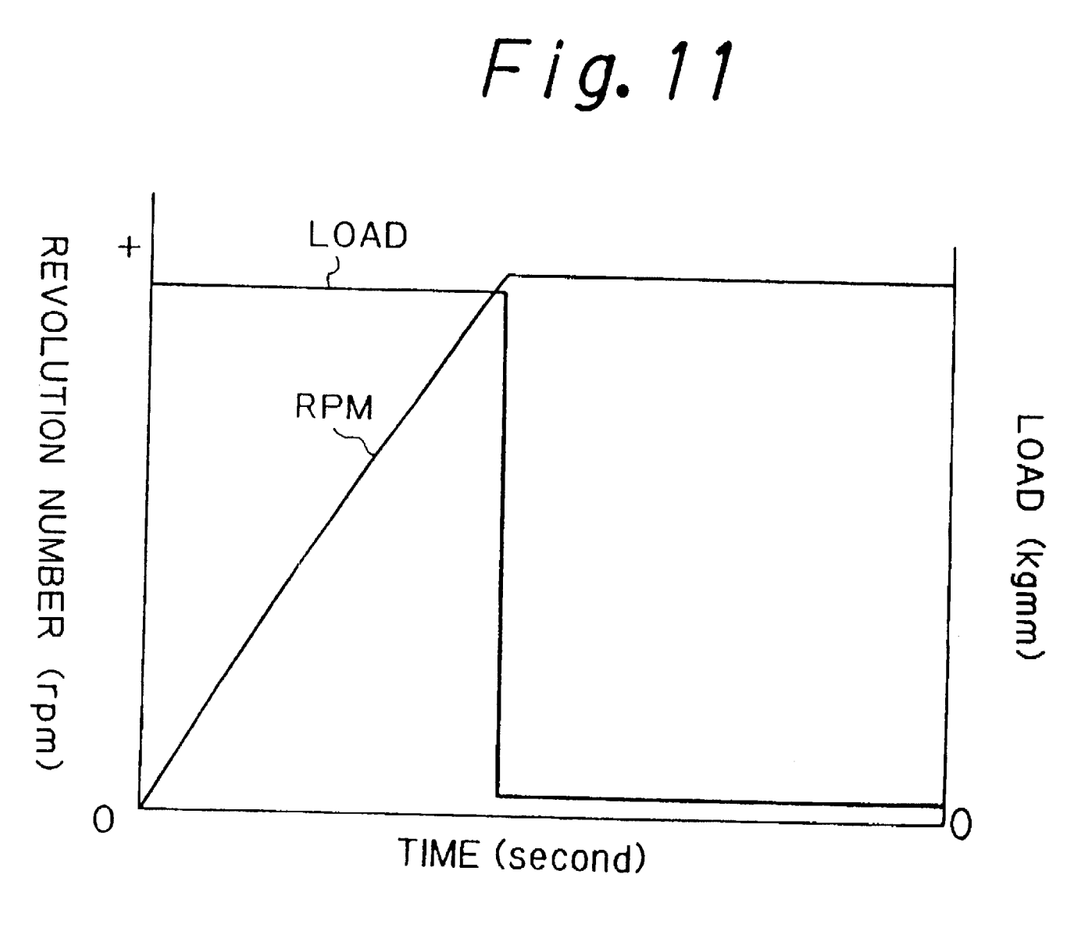
FIG. 11 is a graph showing a load applied to a driving source.

The load imposed by the sliding portion in step 4, the frictional load in step 5 and the load applied to the driving source are calculated for every rpm of the driving source. The result diplay processing portion 14 fetches the resultant calculation from the result file 13. The display device 3 displays the connection data for each component as shown in Table 1, the load data as shown in Table 2, and the load values as shown in Table 3 for every rpm of the driving source according to the format (graph and the like) indicated through the input device 2 by the operator. The load values for different rpm of the driving source vary, e.g. as illustrated in FIG. 11, which shows the load applied to the driving source. In such a way, the load applied to the driving source can be obtained.

TABLE 1

Mechanical Network

| 1  | 6,S | 7-S | 7   |     |     |   |
|----|-----|-----|-----|-----|-----|---|
| ,P | 1,P | 5,S | 4,G | 1,S | 7,G | 2 |
| 2  | 1,P | 5-P | 2   |     |     |   |
| ,B | 2   |     |     |     |     |   |
| 3  | 1,P | 1-P | 1   |     |     |   |
| ,B | 1   |     |     |     |     |   |
| 4  | 2,B | 2-P | 7   |     |     |   |
| ,P | 7,S | 6   |     |     |     |   |
| 5  | 2,B | 2-P | 6   |     |     |   |
| ,P | 6,S | 5   |     |     |     |   |
| 6  | 2,B | 1-P | 4   |     |     |   |
| ,P | 4,S | 3   |     |     |     |   |
| 7  | 2,B | 1-P | 3   |     |     |   |
| ,P | 3,S | 2   |     |     |     |   |
| 8  | 2,B | 1-P | 2   |     |     |   |
| ,P | 2,S | 1   |     |     |     |   |

TABLE 2

Pulley

| parts No.         |      | 1     |       |       |
|-------------------|------|-------|-------|-------|
| rpm ratio         |      | 1.000 | 1.000 |       |
| inertia moment    |      | 0.000 |       |       |
| viscosity         |      | 0     | 0     | 0     |
| frictional torque |      | 0.634 | 0.634 | 0.634 |
| inertia moment    |      | 0.000 |       |       |
| viscosity         |      | 0     | 0     | 0     |
| frictional torque |      | 0.636 | 0.636 | 0.636 |
| inside belt forth |      | 0.814 |       |       |
| F1 direction      |      | 0.058 |       |       |
| inside belt force | (25) | 0.814 | (40)  | 0.814 |
| outside belt force |     | 0     |       |       |
| F2 direction      |      | 0     |       |       |
| outside belt force | (25)| 0     | (40)  | 0     |

TABLE 3

Load Torque

Step Number: 101        Time Step: 0.01000

| No. | Time     | Angular Velocity | Angular Acceleration |
|-----|----------|------------------|----------------------|
| 1   | 0        | 0                | 4.189E+00            |
| 2   | 1.000E-02| 4.189E-02        | 4.189E+00            |
| 3   | 2.000E-02| 8.378E-02        | 4.189E+00            |
| 4   | 3.000E-02| 1.257E-01        | 4.189E+00            |
| 5   | 4.000E-02| 1.676E-01        | 4.189E+00            |
| 6   | 5.000E-02| 2.094E-01        | 4.189E+00            |
| 7   | 6.000E-02| 2.513E-01        | 4.189E+00            |
| 8   | 7.000E-02| 2.932E-01        | 4.189E+00            |
| 9   | 8.000E-02| 3.351E-01        | 4.189E+00            |
| 10  | 9.000E-02| 3.770E-01        | 4.189E+00            |
| 11  | 1.000E-01| 4.189E-01        | 2.094E+00            |
| 12  | 1.100E-01| 4.189E-01        | 1.490E-06            |
| 13  | 1.200E-01| 4.189E-01        | 0                    |
| 14  | 1.300E-01| 4.189E-01        | 0                    |
| 15  | 1.400E-01| 4.189E-01        | 0                    |
| 16  | 1.500E-01| 4.189E-01        | 0                    |
| 17  | 1.600E-01| 4.189E-01        | 0                    |
| 18  | 1.700E-01| 4.189E-01        | 0                    |
| 19  | 1.800E-01| 4.189E-01        | 0                    |

Load Torque (0, 25, 30)

| 1 | 2.419E+00 | 2.419E+00 | 2.419E+00 |
| 2 | 2.419E+00 | 2.419E+00 | 2.419E+00 |
| 3 | 2.419E+00 | 2.419E+00 | 2.419E+00 |
| 4 | 2.419E+00 | 2.419E+00 | 2.419E+00 |
| 5 | 2.419E+00 | 2.419E+00 | 2.419E+00 |
| 6 | 2.419E+00 | 2.419E+00 | 2.419E+00 |
| 7 | 2.419E+00 | 2.419E+00 | 2.419E+00 |

TABLE 3-continued

| Load Torque | | | |
|---|---|---|---|
| Step Number: 101 | | Time Step: 0.01000 | |
| No. | Time | Angular Velocity | Angular Acceleration |
| 8 | 2.419E+00 | 2.419E+00 | 2.419E+00 |
| 9 | 2.419E+00 | 2.419E+00 | 2.419E+00 |
| 10 | 2.419E+00 | 2.419E+00 | 2.419E+00 |
| 11 | 2.417E+00 | 2.417E+00 | 2.417E+00 |
| 12 | 2.415E+00 | 2.415E+00 | 2.415E+00 |
| 13 | 2.415E+00 | 2.415E+00 | 2.415E+00 |
| 14 | 2.415E+00 | 2.415E+00 | 2.415E+00 |
| 15 | 2.415E+00 | 2.415E+00 | 2.415E+00 |
| 16 | 2.415E+00 | 2.415E+00 | 2.415E+00 |
| 17 | 2.415E+00 | 2.415E+00 | 2.415E+00 |
| 18 | 2.415E+00 | 2.415E+00 | 2.415E+00 |
| 19 | 2.415E+00 | 2.415E+00 | 2.415E+00 |

Second Embodiment (FIGS. 12 to 15)

A CAE system for analyzing the load in a mechanical system has been described above in detail. The CAE system for preparing the transmission network in a mechanical system can be composed of the input device 2, the display device 3, the form data input processing portion 4, the graphic data memory portion, the connection of components retrieving and processing portion 6, the connection data memory portion 8, the operation processing portion 7, and the processing portion 15 shown in FIG. 1.

A CAE system for preparing the transmission network will be described with reference to FIGS. 12 to 13.

An example of a connection of components processing portion 6 will be explained with reference to FIGS. 12 and 13. To facilitate the explanation, the CAE system will be described with reference to a two-dimensional mechanical system.

Figure 12:
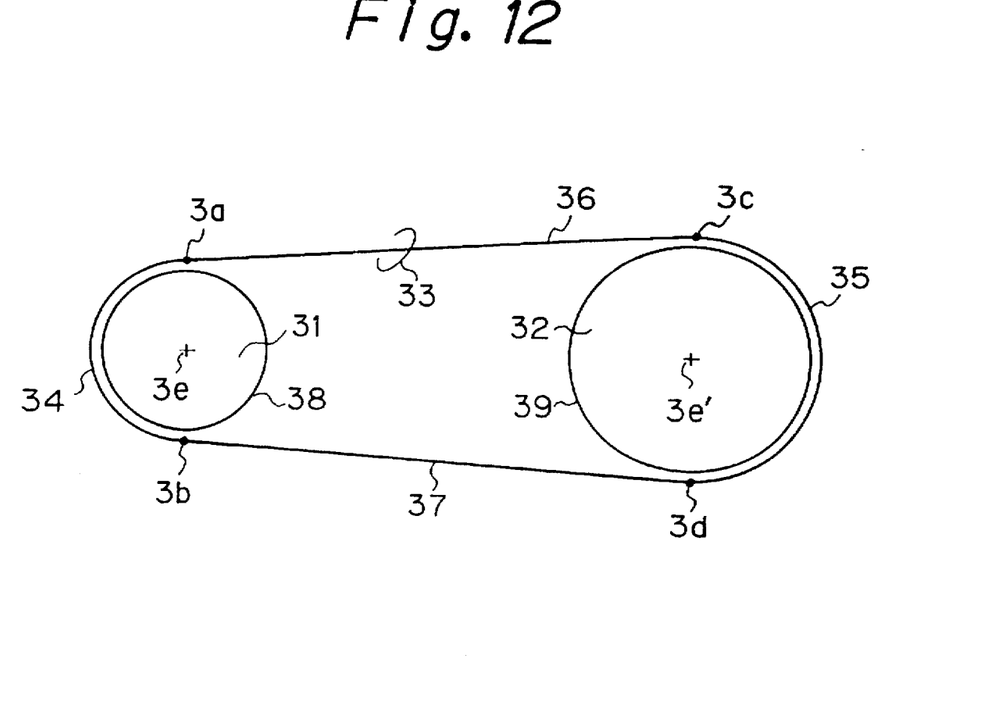
FIG. 12 is a view showing a model of a mechanical system composed of pulleys and belts.

FIG. 12 shows a model composed of pulleys 31 and 32 formed of circles 38 and 39 and a belt 33 formed of arcs 34 and 35 and straight lines 36 and 37. The connection of components retrieving and processing portion 6 retrieves and processes, upon reception of the form data from the graphic data memory portion 5, the connection relation between respective components.

(1) Arrangement of a belt:

As illustrated in FIG. 12, the arcs 34 and 35 and the staight lines 36 and 37, which coincide at points 3a, 3b, 3c and 3d, are extracted from the graphic data memory portion 5, thereby preparing the arrangement of the belt 33.

Figure 14:
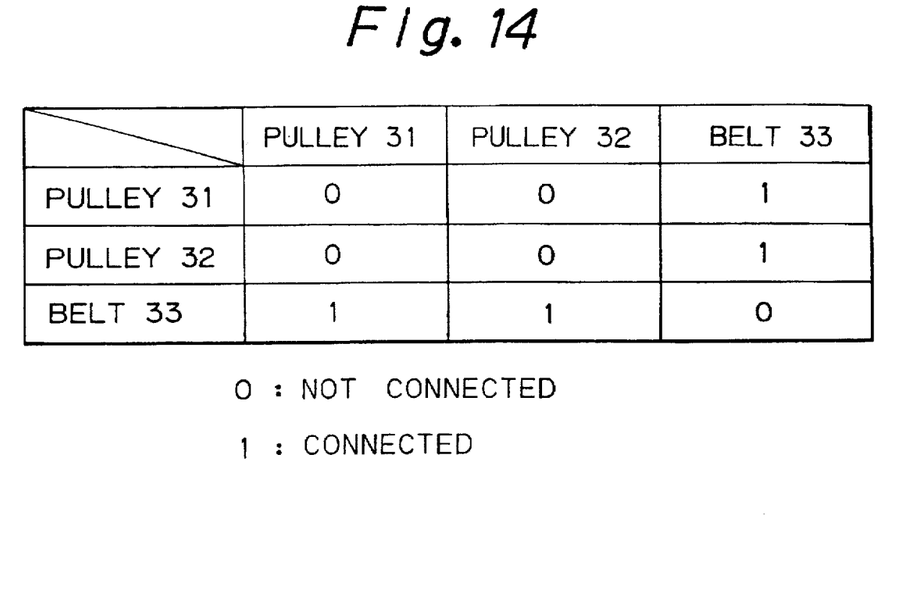
FIG. 14 is a table showing the connection relationships between the components of the mechanical system of FIG. 12.

(2) Retrieval of connections between a belt and pulleys:

As shown in FIG. 12, circles 38 and 39 representing the pulleys 31 and 32 and arcs 34 and 35 representing segments of the belt 33 have central coordinates 3e and 3e'. The combination of the circle 38 and the arc 34 and the combination of the arc 35 and the circle 39 are extracted from the graphic data memory portion 5 to retrieve a connection between the belt 33 and a connection between the pulley 31 and the belt 33 and the pulley 32. In FIG. 14, "0" means that a connecting relation does not exist while "1" means that a connecting relation does exist.

Figure 13:
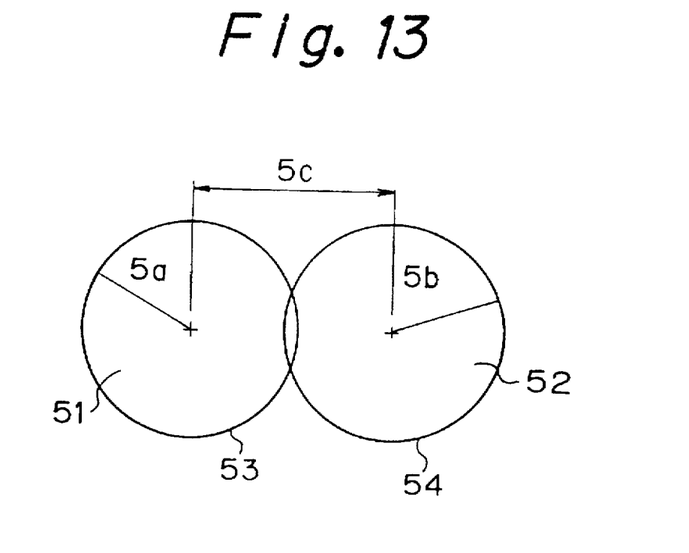
FIG. 13 is a view showing a model of a mechanical system composed of rollers.

(3) Retrieval of a connection between rollers:

Rollers 51 an 52 are indicated by circles as illustrated in FIG. 13. Reference numerals $5a$ and $5b$ each represents a radius, and $5c$ represents the distance between the centers of circles. A combination of circles satisfying the expression of $5a+5b \leq 5c$ is extracted from the graphic data memory portion 5 and the combination of the circles has a connected relationship.

If gears exist, they are subjected to processing in the same manner, not shown.

The connection data thus prepared in the processings set forth above are stored in the connection data memory portion 8.

Figure 15:
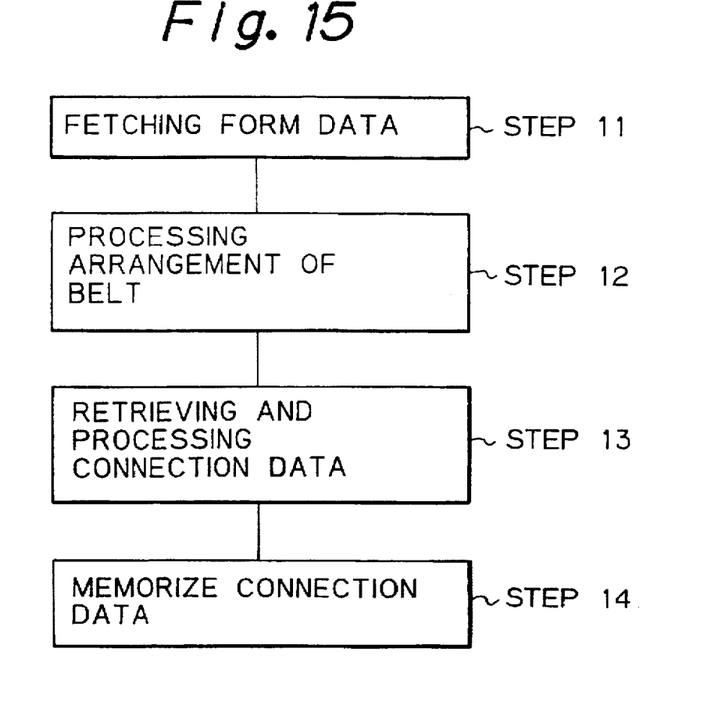
FIG. 15 is a flowchart showing form and connection retrieving and processing procedures.

FIG. 15 is a flowchart showing processings in the second embodiment which are executed in the same manner as the processings in the CAE system in the first embodimet.

Firstly, the form data is fetched from the graphic data memory portion 5 (Step 11), secondly, the arrangement of the belt is subjected to the processing (step 12), thirdly, connections between belts, pulleys, rollers, gears and the like are retrieved and subjected to processing (Step 13) and fourthly, the connection data are stored in the connection memory portion 8 (Step 14).

It is possible to provide a CAE system for preparing the transmission network in a mechanical system if the connection data stored in the connection data memory portion 8 is fetched by a network display processing portion, not shown, thereby displacing the connection relationships between belts 41, pulleys 42, shafts 43, gears 44 and rollers shown in FIG. 8) on the display device 3, or if the connection data stored in the connection data memory 8 can be output to another system.

What is claimed is:

1. A CAE system for preparing a transmission network for a mechanical system having components, comprising:

means for providing graphic data for the components of the mechanical system, the graphic data including position data for each component and form data for each component, the form data for a component specifying the physical configuration of the respective component;

graphic data memory portion means for storing the graphic data;

connection of components retrieving and processing portion means for fetching the graphic data for the mechanical system from the graphic data memory portion means and for preparing connection data from the fetched graphic data, the connection data providing information about how the components are connected to form the mechanical system; and connection data memory portion means for storing the connection data therein.

2. A CAE system for analyzing a load imposed by a mechanical system which is driven by a driving source, the mechanical system having components, comprising:

means for providing graphic data for the components of the mechanical system, the graphic data including information about the forms, positions, material, and connecting states of the components of the mechanical system;

graphic data memory portion means for storing the graphic data;

connection of components retrieving and processing portion means for fetching the graphic data for the mechanical system from the graphic data memory portion means and for preparing connection data from the fetched graphic data, the connection data providing information about how the components are connected to form the mechanical system;

connection data memory portion means for storing the connection data therein; and operation processing portion means for calculating the load imposed on the driving source by the mechanical system based on the graphic data and the connection data.

3. A CAE system for analyzing a load imposed by a mechanical system which is driven by a driving source, the mechanical system having components, comprising:

means for providing graphic data for the components of the mechanical system, the graphic data including information about the forms, positions, materials, and connecting states of the components of the mechanical system;

graphic data memory portion means for storing the graphic data;

connection of components retrieving and processing portion means for fetching graphic data for the mechanical system from the graphic data memory portion means and for preparing connection data from the fetched graphic data, the connection data providing information about how the components are connected to form the mechanical system;

connection data memory portion means for storing the connection data therein;

means, responsive to the connection data, for determining whether any components of the mechanical system are sliding components which slide against one another; and     operation processing portion means for calculating the load imposed on the driving source by the mechanical system based on the graphic data, the connection data, and any sliding components that have been detected.

4. The CAE system of claim 1, wherein the components of the mechanical system include a plurality of pulleys and a belt, and wherein the connection data provides information about which of the pulleys are engaged by the belt.

5. The CAE system of claim 4, wherein the components of the mechanical system additionally include another belt, and wherein the connection data additionally provides information about which of the pulleys are engaged by the another belt.

6. The CAE system of claim 5, wherein the mechanical system additionally includes first and second gears, and wherein the connection data additionally provides information about whether the gears mesh.

7. The CAE system of claim 1, wherein the components of the mechanical system include first and second gears, and wherein the connection data provides information about whether the gears mesh.

8. The CAE system of claim 1, wherein the components of the mechanical system include first and second rollers, and wherein the connection data provides information about whether the rollers touch.

9. The CAE system of claim 1, wherein the components of the mechanical system include a first shaft which is rotated by a driving source, a second shaft which is spaced apart from the first shaft, and a plurality of further components which mechanically connect the first and second shafts so as to rotate the second shaft when the first shaft is rotated by the driving source, and wherein the connection data provides information about which of the further components engages the first shaft, which of the further components engages the second shaft, and which of the further components engage each other.

10. The CAE system of claim 2, wherein the components of the mechanical system include a plurality of pulleys and a belt, and wherein the connection data provides information about which of the pulleys are engaged by the belt.

11. The CAE system of claim 10, wherein the components of the mechanical system additionally include another belt, and wherein the connection data additionally provides information about which of the pulleys are engaged by the another belt.

12. The CAE system of claim 11, wherein the mechanical system additionally includes first and second gears, and wherein the connection data additionally provides information about whether the gears mesh.

13. The CAE system of claim 2, wherein the components of the mechanical system include first and second gears, and wherein the connection data provides information about whether the gears mesh.

14. The CAE system of claim 2, wherein the components of the mechanical system include first and second rollers, and wherein the connection data provides information about whether the rollers touch.

15. The CAE system of claim 2, wherein the components of the mechanical system include a first shaft which is rotated by the driving source, a second shaft which is spaced apart from the first shaft, and a plurality of further components which mechanically connect the first and second shafts so as to rotate the second shaft when the first shaft is rotated by the drive source, and wherein the connection data provides information about which of the further components engages the first shaft, which of the further components engages the second shaft, and which of the further components engage each other.

16. The CAE system of claim 3, wherein the components of the mechanical system include a plurality of pulleys and a belt, and wherein the connection data provides information about which of the pulleys are engaged by the belt.

17. The CAE system of claim 16, wherein the components of the mechanical system additionally include another belt, and wherein the connection data additionally provides information about which of the pulleys are engaged by the another belt.

18. The CAE system of claim 17, wherein the mechanical system additionally includes first and second gears, and wherein the connection data additionally provides information about whether the gears mesh.

19. The CAE system of claim 3, wherein the components of the mechanical system include first and second gears, and wherein the connection data provides information about whether the gears mesh.

20. The CAE system of claim 3, wherein the components of the mechanical system include first and second rollers, and wherein the connection data provides information about whether the rollers touch.

21. The CAE system of claim 3, wherein the components of the mechanical system include a first shaft which is rotated by the driving source, a second shaft which is spaced apart from the first shaft, and a plurality of further components which mechanically connect the first and second shafts so as to rotate the second shaft when the first shaft is rotated by the drive source, and wherein the connection data provides information about which of the further components engages the first shaft, which of the further components engages the second shaft, and which of the further components engage each other.

\* \* \* \* \*